(12) United States Patent
Amazeen et al.

(10) Patent No.: US 6,429,697 B1
(45) Date of Patent: Aug. 6, 2002

(54) MULTI-STAGE, LOW-OFFSET, FAST-RECOVERY, COMPARATOR SYSTEM AND METHOD

(75) Inventors: Bruce Edward Amazeen, Ipswich; Michael C. W. Coln, Lexington; Scott Wayne, Sharon, all of MA (US); Gerald A. Miller, Hudson, NH (US); Mick Mueck, Andover, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/412,659

(22) Filed: Oct. 5, 1999

(51) Int. Cl.[7] .................................................. H03K 5/22
(52) U.S. Cl. ............................ 327/87; 327/67; 327/362; 327/363; 330/85
(58) Field of Search .............................. 327/63, 87, 77, 327/90, 65, 67, 362, 363, 307, 560–563; 341/155, 161; 330/252, 9, 253, 85, 259, 260

(56) References Cited

U.S. PATENT DOCUMENTS 4,599,602 A  * 7/1986 Matzuzawa et al. ........ 341/161
4,883,987 A    11/1989 Fattaruso .................... 327/65
5,600,275 A    2/1997 Garavan ..................... 327/307

OTHER PUBLICATIONS

Behzad Razavi and Bruce A. Wooley, Design Techniques for High–Speed, High Resolution Comparators, IEEE Journal of Solid State Circuits, vol. 27, No. 12, Dec. 1992.

* cited by examiner

*Primary Examiner*—Timothy P. Callahan
*Assistant Examiner*—Minh Nguyen
(74) *Attorney, Agent, or Firm*—Iandiorio & Teska

(57) ABSTRACT

A multi-stage, low-offset, fast-recovery, comparator system and method for: reducing the input offset voltage of the zeroing amplifier by a factor essentially equal to gain of the zeroing amplifier; reducing the input offset voltage of the combined main and zeroing amplifiers by a factor essentially equal to the product of the gains of the main and zeroing amplifiers; and amplifying the input signal to the amplification stage in accordance with the gain of the main amplifier to generate an amplified high-resolution signal.

17 Claims, 5 Drawing Sheets

MULTI-STAGE, LOW-OFFSET, FAST-RECOVERY, COMPARATOR SYSTEM AND METHOD

FIELD OF INVENTION

This invention relates to a multi-stage, low-offset, fast-recovery, comparator system and method and more particularly to such a system and method which minimizes undesirable offset voltages by utilizing an active negative feedback circuit which eliminates overdrive recovery delays.

BACKGROUND OF INVENTION

Successive approximation analog to digital conversion systems (ADC's) utilize a comparator to make a series of comparisons to determine a binary value for an analog input. Comparators are essentially a cascade of dual input amplifier stages which amplify the difference of the two input signals by a gain factor. There are several problems associated with these multi-stage comparator systems, namely any error which occurs at the input of the first amplifier in the series is going to be multiplied by the product of all the individual gains of the amplifiers used in the series. Specifically, if you have a multi stage comparator system which utilizes four amplifier stages, each having a gain of ten, any error which occurs on the input of the first amplifier will be multiplied by a factor of 10,000 ($10^4$). In a practical implementation, the output voltage would be limited by the circuit's power supplies or more likely by some gain limiting clamping circuitry. As can be imagined, all errors which occur at the input to the first amplifier in the chain must be minimized.

During the conversion process, most of the comparisons are easy (non-critical) decisions where the input signal to the comparator is greater than the highest resolution (or least significant bit) of the ADC. However, some comparisons are more difficult (critical) decisions where the input signal is smaller than the least significant bit of the ADC.

A problem associated with these multi-stage comparator systems is that comparators have internal errors which frustrate their use in high precision systems. Specifically, every comparator has an internal voltage offset error ($V_{offset}$) which adds a small voltage to one of the comparator inputs. In a theoretical "ideal" comparator, an input of zero volts applied to each of the comparator inputs (where the comparator has a gain of 1,000) would result in an output voltage of zero, as the difference between the two input signals is zero. However, since comparators have this internal $V_{offset}$ error, one of the two input terminals will appear to have a slightly higher voltage then that which is actually present on its terminal. The amount of this voltage difference is known as the voltage offset error ($V_{offset}$). Typically, the offset voltage for an average comparator is in the range of 10–15 millivolts (10–15 mV). Therefore, in the event that a signal of zero volts is applied to both input terminals of a comparator (having a gain of 1,000), one input signal will be interpreted as the value of the offset voltage (e.g. 10 millivolts) which would result in an output of 10 volts (10 mV*1,000). In a practical implementation, the output voltage would be limited by the circuit's power supplies or more likely by some gain limiting clamping circuitry.

Another problem associated with multi-stage comparator systems is excessive delay due to the overdriven condition that inevitably results from a non-critical comparison. If, in our example, the overdrive condition as described above is present on all four amplifiers, as it often is after a non-critical comparison, the overdrive recovery delay for the comparator will be essentially four times the delay of any one stage. This result will be explained in more detail below, but it is important to note that these additive overdrive recovery delays may dominate the factors limiting the speed of the comparator.

In an effort to reduce the speed limitation due to multiple overdrive recovery delays, various methods of resetting each stage of the comparator between each comparison have been employed, however with limited success.

In an effort to alleviate the problem of offset voltage induced output errors, one particular multi-stage comparator system utilizes a series of capacitors to AC-couple each comparator in the multi-stage comparator system. Since the offset voltage is a DC voltage, any offset voltage will be filtered prior to being applied to the input terminals of the individual comparators. However, this approach does not remove the offset voltage present at the output of each stage and, therefore, the overdrive recovery delays will make the system ill-suited for high speed data processing.

SUMMARY OF THE INVENTION

It is therefore an object of this invention to provide a multi-stage, low-offset, fast-recovery comparator system and method.

It is a further object of this invention to provide such a system and method which can be DC-coupled and minimizes overdrive recovery delay.

It is a further object of this invention to provide such a system and method which improves processing speed by reducing overdrive recovery delay.

It is a further object of this invention to provide such a system and method which can perform high-resolution conversion through the use of standard resolution components.

It is a further object of this invention to provide such a system and method which reduces offset voltage errors to usable levels.

This invention results from the realization that a truly effective multi-stage, low-offset, fast-recovery comparator system and method can be achieved by utilizing a series of amplification stages which minimizes input and output offset voltages through negative feedback.

This invention features a multi-stage, low-offset, fast-recovery, comparator system including: a plurality of self-correcting amplification stages connected in series, each amplification stage having a reset switch connected at its output for returning the output of each amplification stage to the operating input range of the next stage and providing fast response to its next input signal, each amplification stage including: a main amplifier, having a signal input terminal and an offset adjustment input, said main amplifier responsive to an input for generating an output; and a local feedback circuit, responsive to the output, for providing an offset adjustment signal to the offset adjustment input to compensate for the local offset voltage of the main amplifier.

In a preferred embodiment, the local feedback circuit may include a zeroing amplifier circuit, having an input terminal responsive to the output, for generating the offset adjustment signal. The zeroing amplifier circuit may include a zeroing amplifier offset reduction circuit to minimize the input offset voltage of the zeroing amplifier circuit. The zeroing amplifier circuit may have a zero adjustment input terminal, the zeroing amplifier offset reduction circuit including: a first switching means for applying the offset adjustment signal to the zero adjustment input terminal; and a second switching means for applying a predetermined zeroing signal to the input terminal of the zeroing amplifier circuit. The main amplifier may have an offset adjustment input terminal, the local feedback circuit further including: a first switching means for applying the offset adjustment signal to the offset adjustment input terminal of the main amplifier; a second switching means for applying the output of the main amplifier to the input terminal of the zeroing amplifier circuit; a third switching means for applying a zero input signal to the signal input terminal of the main amplifier; and a fourth switching means for applying the output of the previous amplification stage to the signal input terminal of the main amplifier.

This invention also features a multi-stage, low-offset, fast-recovery, comparator system including: a plurality of offset-corrected amplification stages connected in series, each amplification stage having a reset switch connected at its output for returning the output of each amplification stage to the operating input range of the next stage and providing fast response to its next input signal, where each amplification stage is DC-coupled to the next amplification stage in the series.

In a preferred embodiment, each amplification stage may include: a main amplifier having a signal input terminal and an offset adjustment input, said main amplifier responsive to an input for generating an output; and a feedback circuit, responsive to the output, for providing an offset adjustment signal to the offset adjustment input to compensate for the local offset voltage of the main amplifier. The feedback circuit may include a zeroing amplifier circuit, having an input terminal responsive to the output, for generating the offset adjustment signal. The zeroing amplifier circuit may include a zeroing amplifier offset reduction circuit to minimize the input offset voltage of the zeroing amplifier circuit. The zeroing amplifier circuit may have a zero adjustment input terminal, the zeroing amplifier offset reduction circuit including: a first switching means for applying the offset adjustment signal to the zero adjustment input terminal; and a second switching means for applying a predetermined zeroing signal to the input terminal of the zeroing amplifier circuit. The main amplifier may have an offset adjustment input terminal, the local feedback circuit further including: a first switching means for applying the offset adjustment signal to the offset adjustment input terminal of the main amplifier; a second switching means for applying the output of the main amplifier to the input terminal of the zeroing amplifier circuit; a third switching means for applying a zero input signal to the signal input terminal of the main amplifier; and a fourth switching means for applying the output of the previous amplification stage to the signal input terminal of the main amplifier.

This invention also features a multi-stage, low-offset, fast-recovery, comparator system including: a plurality of self-correcting amplification stages connected in series, each amplification stage having a reset switch connected at its output for returning the output of each amplification stage to the operating input range of the next stage and providing fast response to its next input signal, each amplification stage including: a main amplifier having a signal input terminal and an offset adjustment input, said main amplifier responsive to an input for generating an output; and a local feedback circuit, responsive to the output, for providing an offset adjustment signal to the offset adjustment input to compensate for the local offset voltage of the main amplifier, the local feedback circuit including: a zeroing amplifier circuit, having an input terminal responsive to the output, for generating the offset adjustment signal, said zeroing amplifier circuit including a zeroing amplifier offset reduction circuit to minimize the input offset voltage of the zeroing amplifier.

In a preferred embodiment, the zeroing amplifier circuit may have a zero adjustment input terminal, the zeroing amplifier offset reduction circuit including: a first switching means for applying the offset adjustment signal to the zero adjustment input terminal; and a second switching means for applying a predetermined zeroing signal to the input terminal of the zeroing amplifier. The main amplifier may have an offset adjustment input terminal, the local feedback circuit further including: a first switching means for applying the offset adjustment signal to the offset adjustment input of the main amplifier; a second switching means for applying the output of the main amplifier to the input terminal of the zeroing amplifier; a third switching means for applying a zero input signal to the signal input terminal of the main amplifier; and a fourth switching means for applying the output of the previous amplification stage to the signal input terminal of main amplifier.

This invention also features a method for reducing voltage offset in a single amplification stage of a multistage amplifier, having a zeroing amplifier and a main amplifier including the steps of: reducing the input offset voltage of the zeroing amplifier by a factor essentially equal to the gain of the zeroing amplifier; reducing the input offset voltage of the combined main and zeroing amplifiers by a factor essentially equal to the product of the gains of the main and zeroing amplifier; and amplifying the input signal to the amplification stage in accordance with the gain of the main amplifier to generate an amplified high resolution signal.

In a preferred embodiment, the step of reducing the input offset voltage of the zeroing amplifier may include: applying a zero signal to the input terminals of the zeroing amplifier; connecting the zeroing amplifier output signal, via negative feedback, to the zero input adjustment terminal of the zeroing amplifier; and connecting and storing an adjustment voltage that reduces the input offset voltage of the zeroing amplifier. The step of reducing the input offset voltage of the main amplifier may include: applying a zero signal to the input terminals of the main amplifier; connecting the output of the main amplifier to the input of the "offset corrected" zeroing amplifier; connecting the output of the zeroing amplifier, via negative feedback, to the offset adjustment input of the main amplifier; and generating and storing an adjustment voltage that reduces the input offset voltage of the main amplifier. The method may further include the step of returning the amplified high resolution signal to the operating input range of the next amplification stage to provide fast response to its next input signal.

BRIEF DESCRIPTION OF THE DRAWINGS

Other objects, features and advantages will occur to those skilled in the art from the following description of a preferred embodiment and the accompanying drawings, in which.

DISCLOSURE OF PREFERRED EMBODIMENT

Figure 1:
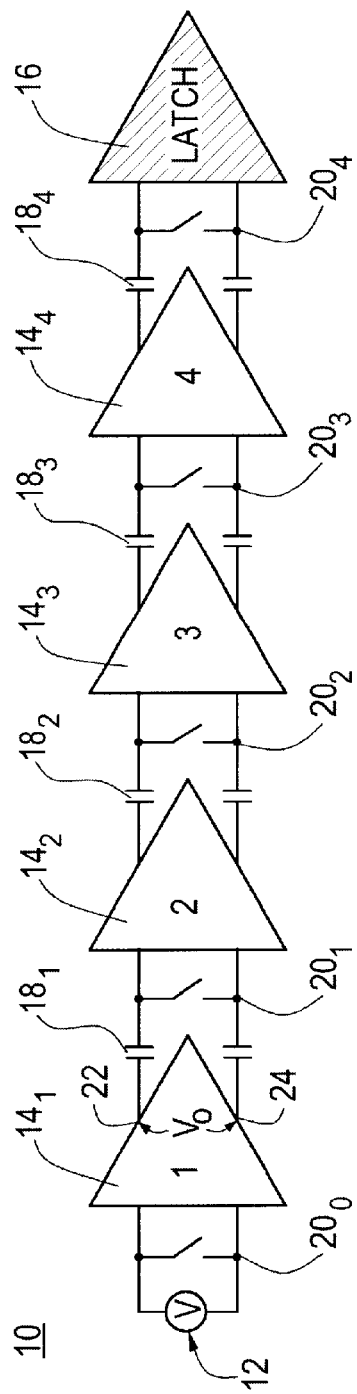
FIG. 1 is a schematic view of a prior art capacitor-coupled multi-stage comparator.
Figure 2:
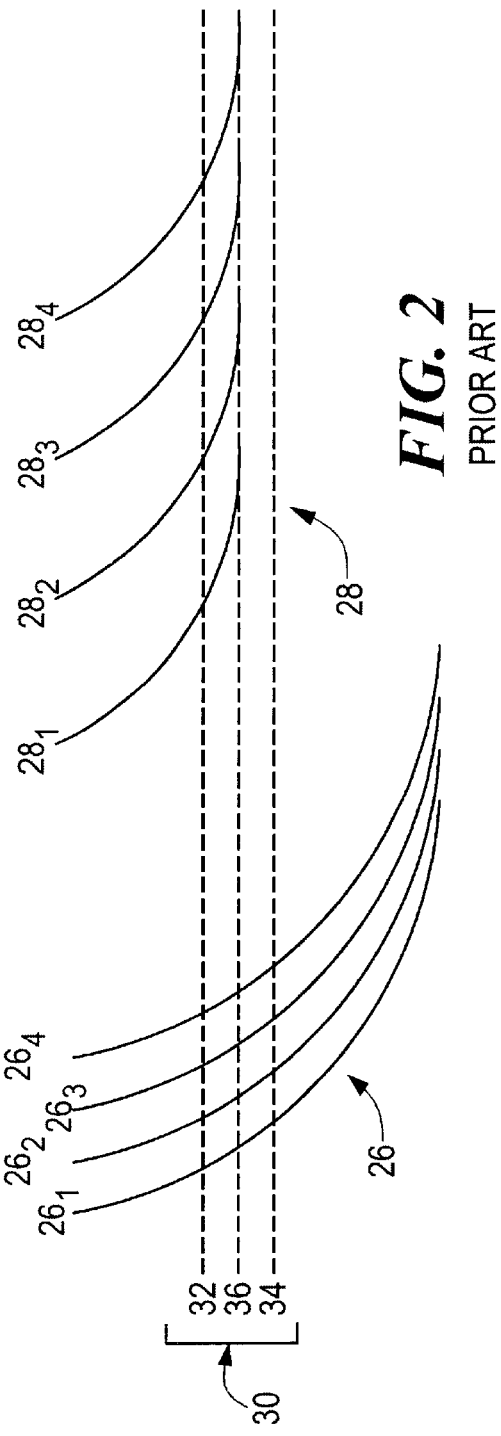
FIG. 2 is two sets of waveforms showing the overdrive recovery delay of the prior art circuit of FIG. 1.

The prior art capacitor coupled multi-stage comparator system 10, FIG. 1, can be used to illustrate both the previous method of storing offset canceling voltages on the coupling capacitors and, with the aid of FIG. 2, the source of and additive properties of overdrive recovery delay.

Prior art capacitor-coupled multi-stage comparator system 10, FIG. 1, produces a considerable amount of lag as the input signal 12, applied to the first amplifier $14_1$ in the amplifier chain $14_{1-4}$ propagates through system 10 to latch 16. This time delay is induced as a result of the capacitor pairs $18_{1-4}$ used to isolate the individual amplifiers $14_{1-4}$ of the multi-stage comparator system 10.

Typically, a block of time is set aside prior to the beginning of the comparison sequence to auto-zero the comparator system. During that time, the comparator $14_1$ is disconnected from the input 12 while switches $20_{0-4}$ are closed. Each amplifier now has zero volts at its inputs, so its outputs will differ by the output offset voltage. For example, if the first amplifier $14_1$ has a gain of 10 and an input offset voltage of 10 mV, outputs 22 and 24 will differ by 100 mV (10 mV*10). Since the pair of capacitors $18_1$ are connected together at the input of the second amplifier $14_1$, the 100 mV output offset voltage will also appear as a difference in the voltages on the capacitor pair $18_1$. A similar situation exists with amplifiers $14_{2-4}$ and capacitor pairs $18_{2-4}$. At the end of the auto zero time, switches $20_{0-4}$ will open, leaving the offset canceling voltages on capacitors $18_{1-4}$ such that if the input 12 to amplifier $14_1$ is zero, the input to latch 16 will also be zero, in spite of the voltage differences at the output of each amplifier $14_{1-4}$.

FIG. 2 illustrates the overdrive recovery problem of the prior art multi-stage comparator system. This figure displays the behavior of the output voltages of each of the four amplifiers of FIG. 1 in relation to time during a non-critical comparison 26 and a critical comparison 28. Reference lines 30 show the limits of the linear (or responsive) region of the input voltage range of each amplifier. This includes an upper limit 32 and a lower limit 34. The linear input range of a comparator is less than the comparator's output voltage range due to its gain. This linear input range represents the only values of input voltage that can cause the comparator's output to change. Both of the comparisons shown in FIG. 2 are assumed to be following a previous non-critical comparison that has left the amplifier output voltages well outside the linear input range.

In the non-critical comparison case, a voltage is applied to the comparator which is large enough and of the appropriate polarity to drive the comparator's output to its maximum value in the other direction (reverse polarity). The output $26_1$ of the first amplifier changes first and enters into the linear input range of the second amplifier. When it crosses the center 36 of the linear region 30, the output $26_2$ of the second amplifier starts down towards the linear input range of the third amplifier and so on. The overdrive recovery delay is the time from when the input is first applied to the time when the output of the fourth amplifier $26_4$ crosses upper limit 32 of active region 30.

In the critical comparison case, the voltage applied to the comparator is small enough such that all the outputs will end up in the linear input range. The major difference in the critical case is that the rate of change of the outputs in these amplifiers decreases exponentially as they approach their final values. Therefore, the time taken for each output to reach the linear input region 30 of its successor (amplifier) is much greater and, hence, the delay until the output of the fourth amplifier $28_4$ reaches upper limit 32 of active region 30 is much greater and is roughly four times the delay of any one amplifier.

Figure 3:
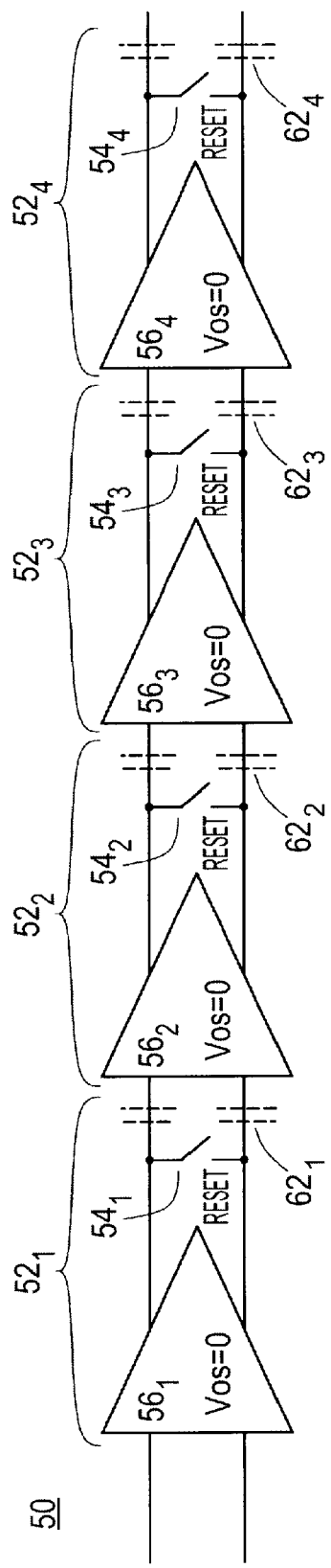
FIG. 3 is a schematic view of the multi-stage, low-offset, fast-recovery comparator system of this invention.

The multi-stage, low-offset, fast-recovery, comparator system 50, FIG. 3, according to this invention, includes a plurality of self-correcting amplification stages $52_{1-4}$ corrected in series. Each amplification stage has a reset switch $54_{1-4}$ connected at the output of each amplifier $56_{1-4}$ for returning the output of each amplification stage $52_{1-4}$ to the linear operating input range of the next stage, thereby providing fast response to the next input signal. As explained later in detail, each of these amplification stages will have essentially a zero offset voltage, thus eliminating the problems concerning the amplification inaccuracies described above. Further, while FIG. 3 shows the multi-stage, low-offset, fast-recovery, comparator system 50 as having four amplification stages $52_{1-4}$, this is for illustrative purposes only and is not intended to be a limitation of the invention. The number of stages utilized in the multi-stage, low-offset, fast-recovery, comparator system 50 will be determined by the desired resolution of the system. For example, since this system is often used in an analog to digital converter (ADC), as the number of bits of the ADC is increased, the resolution of the system must be increased accordingly, since the voltage difference between the individual binary values of the output will be decreased.

FIG. 3 shows a DC-coupled version of the comparator system of this invention. No loss of performance would result if capacitors $62_{1-4}$ (shown in phantom) were inserted to provide common mode level shifting. However, note that if an offset canceling voltage were stored on capacitors $62_{1-4}$ (as in the prior art), the effectiveness of the reset switch in removing overdrive recovery delay would be compromised. Specifically, the reset switch cannot remove the offset canceling voltages from the coupling capacitors, as the overall zero condition would be altered. If this were the case, when reset switches $54_{1-4}$ were applied, the inputs of comparators $56_{2-4}$ would not be zero (as they are in the present invention) but would be at the negative of the output offset of the previous stage, due to the voltage differences stored on the capacitors. Further, when the reset switches were opened so a comparison can begin, those amplifiers would respond to those offset voltages before responding to the input signal and such offsets would result in an overdrive condition, leading to a recovery delay.

Figure 4:
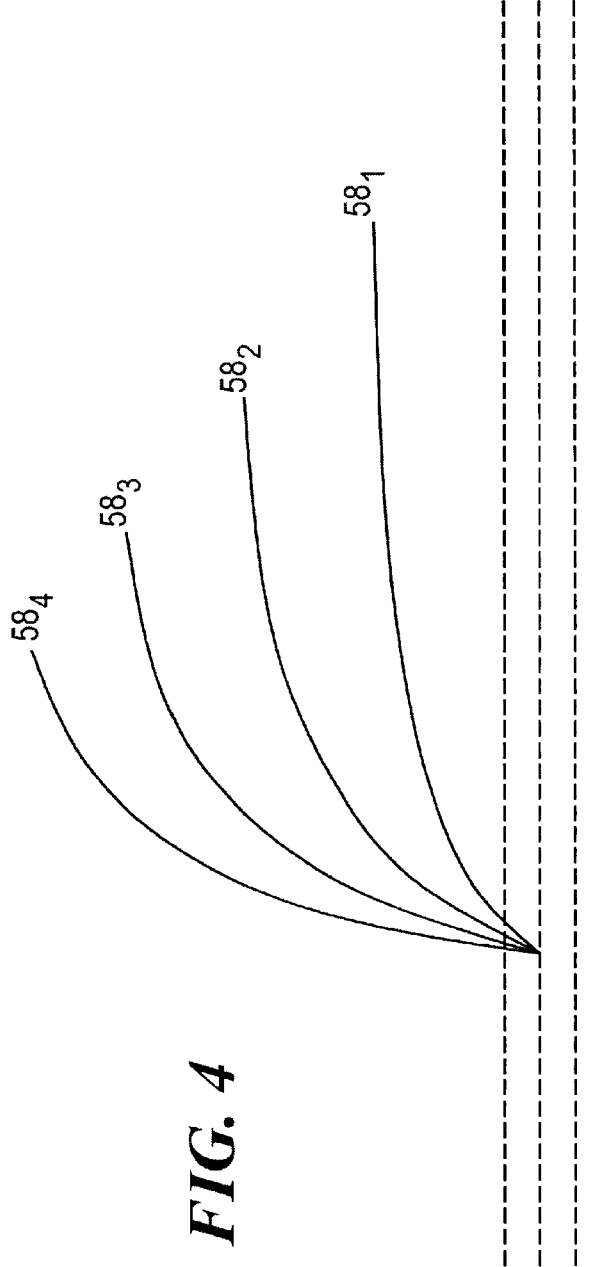
FIG. 4 is a set of waveforms showing the improved overdrive recovery delay of the invention of FIG. 3.

FIG. 4 shows the behavior of the output of each amplifier $52_{1-4}$ during either a critical or non-critical comparison. Since reset switches $54_{1-4}$ return all the amplifier outputs to the center of the linear input range 60 after every comparison, the nature of the previous comparison is unimportant and there is never an overdrive recovery delay. Reset switches $54_{1-4}$ are opened some time after the input to the comparator is applied. A typical delay between applying the input signal to the amplification stage and opening its respective reset switch is 10 ns. Therefore, the output of the first amplifier $56_1$ immediately responds to its input, the output of the second amplifier $56_2$ immediately responds to the output of the first amplifier, the output of the third amplifier immediately responds to the output of the second amplifier, and so on, as shown in FIG. 4. This is all possible because each of these amplifier stages $52_{1-4}$ will have essentially zero offset voltage (as will be explained later in greater detail).

Figure 5:
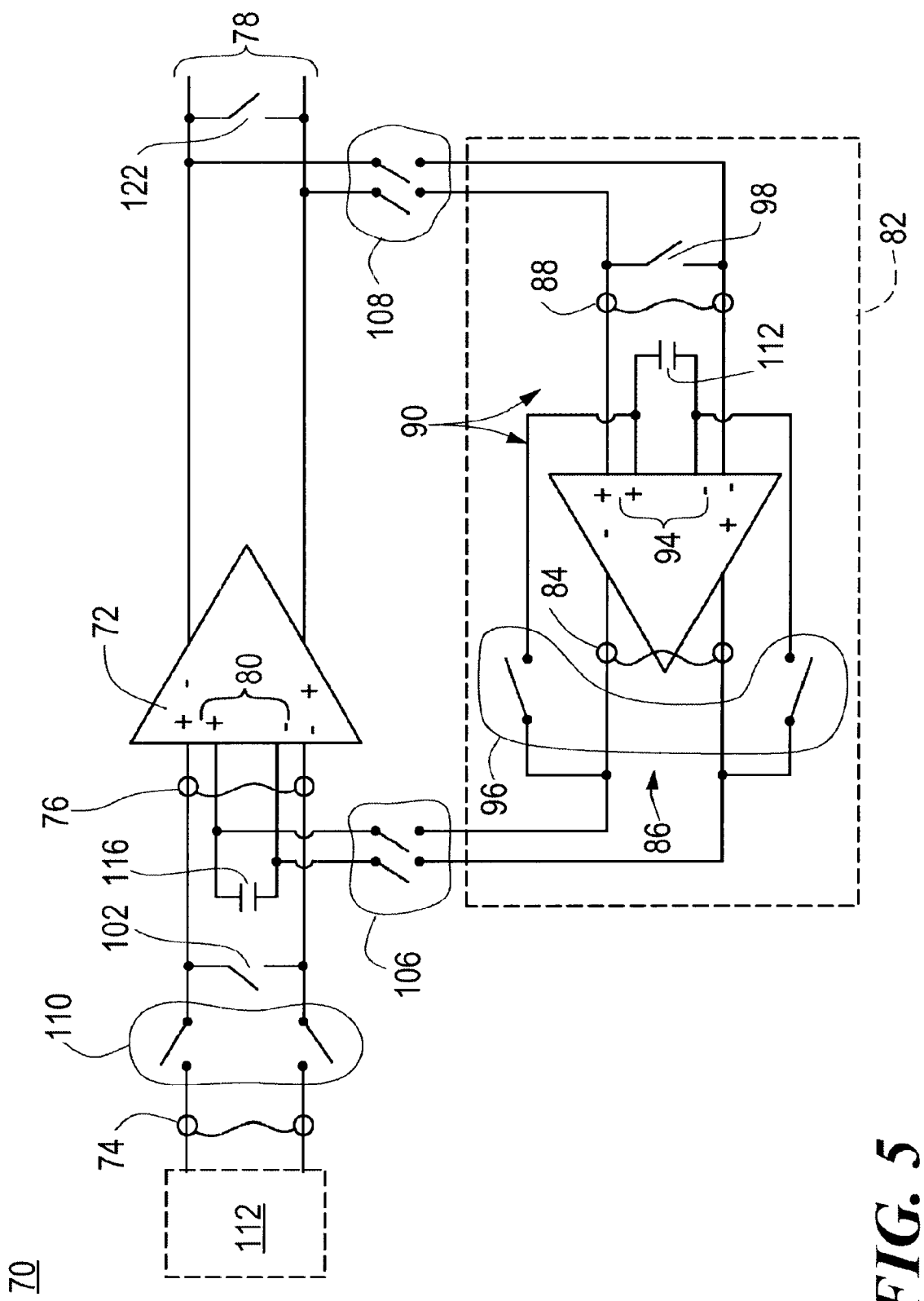
FIG. 5 is a schematic view of a single stage of the multi-stage, low-offset, fast-recovery comparator system of this invention.

There is shown in FIG. 5, a single stage 70 of the multi-stage, low-offset, fast-recovery, comparator system.

Figure 6:
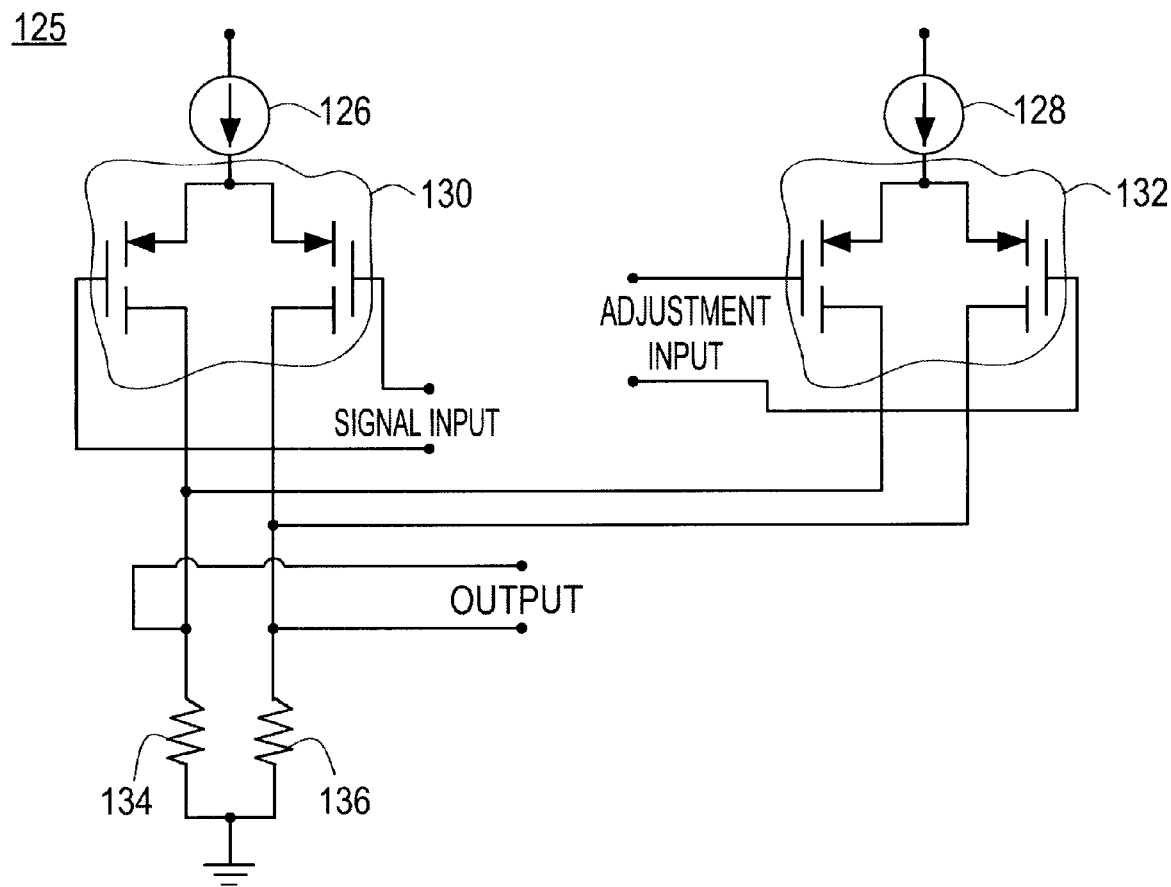
FIG. 6 is a schematic view of a typical embodiment of each of the amplifiers in an amplification stage of this invention.

Each stage in the system includes a main amplifier 72, which is responsive to an input signal 74 received on input terminal 76 and generates an output signal 78. Further, offset adjustment input terminal 80 is included on main amplifier 72. A typical embodiment of main amplifier 72 is shown in FIG. 6.

A local feedback circuit 82, FIG. 5, responsive to the output 78 of the main amplifier 72, provides an offset adjustment signal 84 to the offset adjustment input terminal 80 of main amplifier 72 to compensate for the local offset voltage of main amplifier 72.

Switch mechanisms 102, 106 and 108 activate the feedback path and reset to zero the signal present on input terminal 76 of main amplifier 72. Capacitor 116 is a storage device which stores the offset adjustment voltage present on offset adjustment input terminals 80 such that the offset of the main amplifier will remain compensated during subsequent operations.

Local feedback circuit 82 includes a zeroing amplifier circuit 86, having an input terminal 88, responsive to the output 78 of the main amplifier 72, for generating offset adjustment signal 84. A typical embodiment of zeroing amplifier circuit 86 is shown in FIG. 6. Zeroing amplifier circuit 86, FIG. 5, further includes a zeroing amplifier offset reduction circuit 90 for minimizing the input offset voltage of the zeroing amplifier circuit 86. The output offset voltage is the product of the input offset voltage and the gain of the amplifier. For example, if there is a typical input offset voltage of 10–15 millivolts and a gain of 100 on zeroing amplifier circuit 86, the output offset voltage is 1.00–1.50 volts.

Zeroing amplifier circuit 86 includes zero adjustment input terminal 94 to compensate for the local offset voltage of zeroing amplifier circuit 86. Zeroing amplifier offset reduction circuit 90 includes: first switching means 96 for applying the offset adjustment signal 84 to zero adjustment input terminal 94; and second switching means 98 for applying a predetermined zeroing signal to the signal input terminal 88 of zeroing amplifier circuit 86. While in this particular situation, second switching means 98 is shown as shorting input terminals 88 together, this is for illustrative purposes only and is not intended to be a limitation of the invention. Local feedback circuit 82 includes: first switching means 106 for applying offset adjustment signal 84 to offset adjustment input terminal 80 of main amplifier 72; second switching means 108 for applying output signal 78 of main amplifier 72 to input terminal 88 of zeroing amplifier circuit 86; third switching means 102 for applying a zero input signal to the input terminal 76 of main amplifier 72; and fourth switching means 110 for applying the output of the previous amplification stage 112 to the input terminal 76 of main amplifier 72. While in this particular situation, third switching means 102 is shown as shorting input terminals 76 together, this is for illustrative purposes only and is not intended to be a limitation of this invention. Additionally, while in this particular example, the first and second switching means 96 and 98 of zeroing amplifier offset reduction circuit 90 and the first, second, third and fourth switching means 106, 108, 102 and 110 of local feedback circuit 82 are described as discrete devices, this is not a limitation of the invention. For example, first switching means 96 of zeroing amplifier offset reduction circuit 90 and first switching means 106 of local feedback circuit 82 could be a double pole, double throw (DPDT) switch, which when in the first position, applies offset adjustment signal 84 to zero adjustment input terminal 94 (performing the function of first switching means 96 of zeroing amplifier offset reduction circuit 90). Conversely, when this switch is in the second position, it applies offset adjustment signal 84 to the offset adjustment input terminal 80 of main amplifier 72 (performing the function of first switching means 106 of local feedback circuit 82). Capacitor 112 is a storage device which stores the offset adjustment voltage present on zero adjustment input terminal 94, such that the offset of the zeroing amplifier will remain compensated during subsequent operations.

During operation of the multi-stage, low-offset, fast-recovery, comparator system, each amplification stage 70 performs a series of three operations, namely: 1) auto-zeroing the zeroing amplifier circuit 86; 2) auto-zeroing the main amplifier 72; and 3) processing the input signal 74. Each operation will be described in as follows.

Auto-zeroing the zeroing amplifier: The first step in the operation of amplification stage 70 is auto-zeroing the zeroing amplifier circuit 86. Switching means 98 is closed and switching means 108 is opened to apply a predetermined zeroing signal to the input terminal 88 of zeroing amplifier circuit 86. Typically, the predetermined zeroing signal is zero volts and, therefore, the initial input to zero input adjustment terminal 94 is zero volts. Switching means 96 is closed and switching means 106 is opened to feed back (via negative feedback) offset adjustment signal 84 to the zero adjustment input terminal 94 of zeroing amplifier circuit 86. Switching means 102 is closed and switching means 110 is opened to apply a predetermined offset signal to input terminal 76 of main amplifier 72. Typically, the predetermined offset signal is zero volts and, therefore, the input applied to input terminal 76 of main amplifier 72 is zero volts. Therefore, the output of zeroing amplifier circuit 86 (which is offset adjustment signal 84) is equal to the negative of the input offset voltage of the zeroing amplifier. This signal is applied, via negative feedback, to zero input adjustment terminal 94. Storage device 112 (typically a capacitor) stores the value applied to zero input adjustment terminal 94. A typical value for this capacitor is 2 pf. By negative feedback of the output offset voltage (or negative input offset voltage) of the zeroing amplifier circuit 86 to its zero input adjustment terminal 94, the feedback loop stabilizes to a condition where the input and output offset voltages are reduced by the gain of the zeroing amplifier circuit 86. This is explained below in greater detail.

The next step requires auto-zeroing the main amplifier. Switching means 96 is opened and switching means 106 is closed to provide offset adjustment signal 84 to offset adjustment input terminal 80 of main amplifier 72. Storage device 116 (typically a capacitor) stores the value applied to offset adjustment input terminal 80. A typical value for this capacitor is 5 pf Switching means 98 is opened and switching means 108 is closed to apply output signal 78 to the input terminal 88 of zeroing amplifier circuit 86. Switching means 102 remains closed and switching means 110 remains open to continue to apply a predetermined offset signal to input terminal 76 of main amplifier 72. Once these switches are set to these positions, a situation occurs which is similar to that which occurred in the first step. Since the predetermined offset signal and the predetermined reference signal are typically zero volts, the output signal 78 of main amplifier 72 is equal to the output offset voltage of main amplifier 72. This signal is then fed back (via negative feedback) through the zeroing amplifier to the offset adjustment input terminal 80 of main amplifier 72. As in step 1), by feeding back, via negative feedback, the output offset voltage of the main amplifier 72 to its offset adjustment input terminal 80, the feedback loop stabilizes to a condition where the input offset voltage is reduced by the product of the gains of the main amplifier 72 and zeroing amplifier 86. This will be explained below in greater detail.

When processing the input signal, each amplification stage of the multi-stage, low-offset, fast-recovery, comparator system appears to be an amplifier with virtually no offset voltage. Switching means 110 is closed, applying input signal 74 to input terminal 76 of the first main amplifier 72. Further, switching means 98 and 108 are opened to isolate the output 78 from the feedback circuit 82. This allows main amplifier 72 and reset switch 122 to process input signal 74 while minimizing input offset and overdrive recovery delay, thus providing a high resolution output signal 78.

To aid in the understanding of the manner in which the three above-stated steps occur, the following explanation is provided. It is assumed that: open-loop gain of the zeroing amplifier is 1000; the input offset voltage of the zeroing amplifier is 10 mV; the open loop gain of the main amplifier is 10; and the input offset voltage of the main amplifier is –20 mV. These values are for illustrative purposes only and are not intended to be a limitation of the invention.

Auto-Zeroing the Zeroing Amplifier:

The output (offset adjustment signal 84) of zeroing amplifier circuit 86 is equal to the gain (1000) times the sum of the signal applied to the input terminal 88 of the zeroing amplifier circuit 86 ($\text{Input}_{Zero\ Amp}$), the signal applied to the zero adjustment input terminal 94 of the zeroing amplifier 86 ($\text{Adjust}_{Zero\ Amp}$) less the input offset voltage of the zeroing amplifier circuit 86 (10 mV).

$$\text{Output}_{Zero\ Amp}=1000*(\text{Input}_{Zero\ Amp}+\text{Adjust}_{Zero\ Amp}-10\text{ mV}) \quad (1)$$

The input terminal 88 of the zeroing amplifier circuit 86 is tied to a zero volt reference voltage.

$$\text{Input}_{Zero\ Amp}=0 \quad (2)$$

Since the output (offset adjustment signal 84) of zeroing amplifier circuit 86 is fed back, via negative feedback, to the zero adjustment input terminal 94 of the zeroing amplifier circuit 86, this output takes on a negative value.

$$\text{Adjust}_{Zero\ Amp}=-\text{Output}_{Zero\ Amp} \quad (3)$$

$$\text{Output}_{Zero\ Amp}=1000*(-\text{Output}_{Zero\ Amp}-10\text{ mV}) \quad (4)$$

$$\text{Output}_{Zero\ Amp}=-1000*\text{Output}_{Zero\ Amp}-10\text{ V}$$

$$1001*\text{Output}_{Zero\ Amp}=-10\text{ V}$$

$$\text{Output}_{Zero\ Amp}=-9.99001\text{ mV} \quad (5)$$

Once Equation (5) is solved, the result can be used in Equation (1) for the variable $\text{Adjust}_{Zero\ Amp}$ since the output signal is fed back to the zero adjustment input terminal 94. The resulting transfer function of the offset corrected zeroing amplifier can then be found. Note that the effective input offset voltage of the zeroing amplifier after the offset correction has been reduced from the initial offset (10 mV) to 10 $\mu$V.

$$\text{Output}_{Zero\ Amp}=1000*(\text{Input}_{Zero\ Amp}+9.99001\text{ mV}-10\text{ mV}) \quad (6)$$

$$\text{Output}_{Zero\ Amp}=1000*(\text{Input}_{Zero\ Amp}-9.99\ \mu\text{V}) \quad (7)$$

Auto-Zeroing the Main Amplifier:

The output (78) of main amplifier 72 is equal to the gain (10) times the sum of the signal applied to the input terminal 76 of the main amplifier 72 ($\text{Input}_{Main\ Amp}$), the signal applied to the offset adjustment input terminal 80 of the main amplifier 72 ($\text{Adjust}_{Main\ Amp}$) less the input offset voltage of the main amplifier 72 (–20 mV).

$$\text{Output}_{Main\ Amp}=10*(\text{Input}_{Main\ Amp}+\text{Adjust}_{Main\ Amp}+20\text{ mV}) \quad (8)$$

The input terminal 76 of the main amplifier 72 is connected to a zero volt reference voltage.

$$\text{Input}_{Main\ Amp}=0 \quad (9)$$

Equation (9) can be inserted into Equation (8).

$$\text{Output}_{Main\ Amp}=10*(\text{Adjust}_{Main\ Amp}+20\text{ mV}) \quad (10)$$

During this second step, the output (offset adjustment signal 84) of the zeroing amplifier is now connected, via negative feedback, to the offset adjustment input terminal 80 of the main amplifier.

$$\text{Adjust}_{Main\ Amp}=-\text{Output}_{Zero\ Amp} \quad (11)$$

Also, the input of the zeroing amplifier is connected to the output of the main amplifier.

$$\text{Input}_{Zero\ Amp}=\text{Output}_{Main\ Amp} \quad (12)$$

Equations (11) and (12) can now be inserted into the previously derived transfer function of the offset corrected zeroing amplifier (Equation 7).

$$\text{Adjust}_{Main\ Amp}=-1000*(\text{Output}_{Main\ Amp}-9.99\ \mu\text{V}) \quad (13)$$

Now Equations (10) and (13) can be combined and solved for the offset adjustment signal that will be developed for the main amplifier during this second step.

$$\text{Adjust}_{Main\ Amp}=-19.997001\text{ mV} \quad (14)$$

Once this main amplifier offset adjustment signal has been stored, the result of Equation (14) can be inserted into the transfer function of the main amplifier (Equation 8) to derive the transfer function of the combined amplifier stage.

$$\text{Output}_{Main\ Amp}=10*(\text{Input}_{Main\ Amp}-19.997001\text{ mV}+20\text{ mV}) \quad (15)$$

$$\text{Output}_{Main\ Amp}=10*(\text{Input}_{Main\ Amp}+2.999\ \mu\text{V}) \quad (16)$$

Note that the effective input offset voltage of the combined amplifier stage after the two steps of offset correction has been reduced from the initial offset of the main amplifier (20 mV) to merely 3 $\mu$V. In the third step, the multiple independently offset corrected amplifier stages are connected in cascade to operate as a high-speed, high-gain comparator.

A typical embodiment of each of main amplifier 72 and zeroing amplifier circuit 86 is shown in FIG. 6. Amplifier 125 includes two current sources 126 and 128 which provide current to transistor pairs 130 and 132. The voltage drop across load devices 134 and 136 is the output signal present on the amplifier output terminals.

Figure 7:
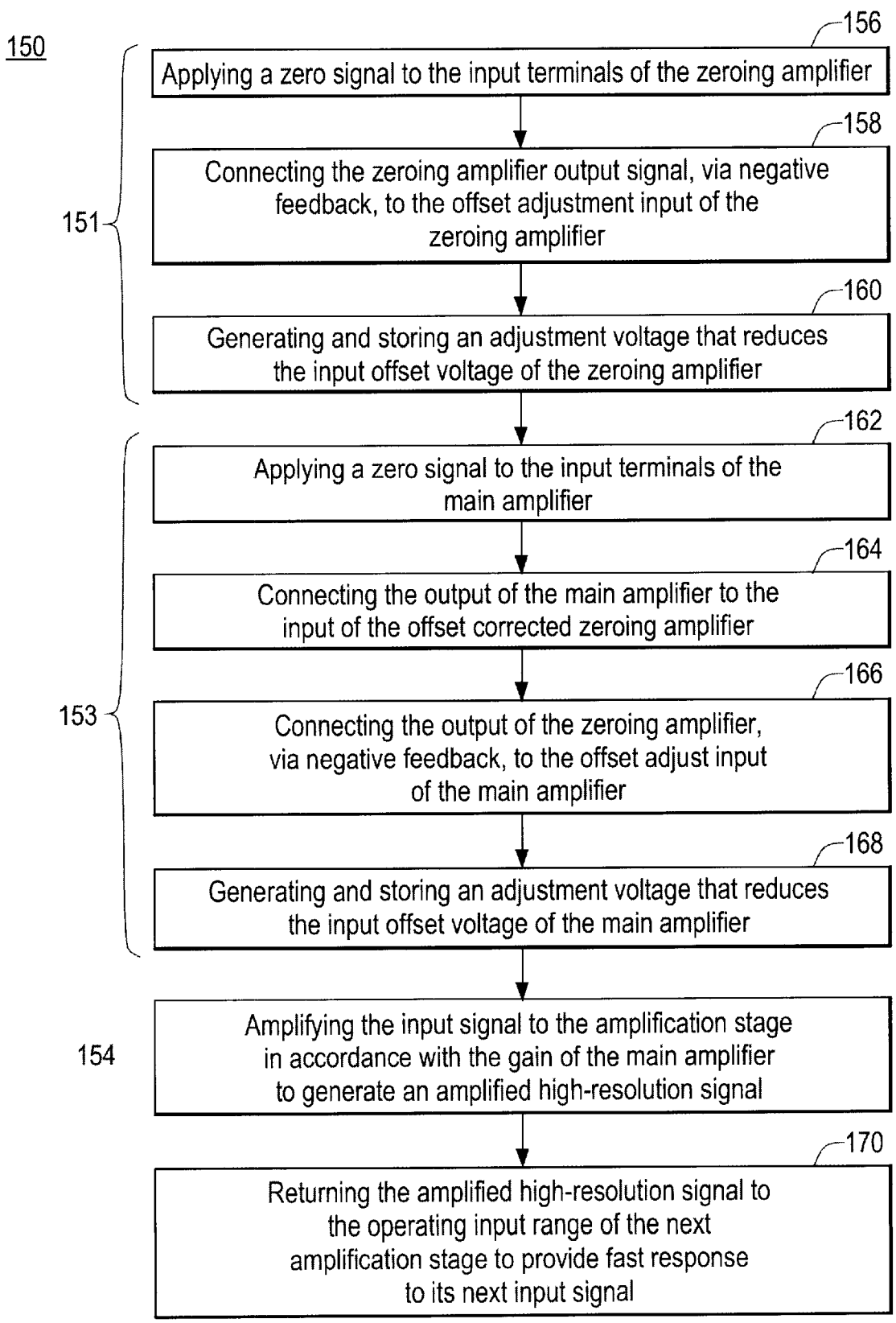
FIG. 7 is a flow chart of the method of reducing voltage offset in a single amplification stage of this invention.

The method 150, FIG. 7, according to this invention, of reducing voltage offset in a single amplification stage, having a zeroing amplifier and a main amplifier, includes the steps of: reducing 151 the input offset voltage of the zeroing amplifier by a factor essentially equal to the gain of the zeroing amplifier; reducing 153 the input offset voltage of the combined main and zeroing amplifiers by a factor essentially equal to the product of the gains of the main and zeroing amplifiers; and amplifying 154 the input signal to the amplification stage in accordance with the gain of the main amplifier to generate an amplified high-resolution signal.

The step of reducing 151 the input offset voltage of the zeroing amplifier includes: applying 156 a zero signal to the input terminals of the zeroing amplifier; connecting 158 the zeroing amplifier output signal, via negative feedback, to the zero input adjustment terminal of the zeroing amplifier; and generating and storing 160 an adjustment voltage that reduces the input offset voltage of the zeroing amplifier. The step of reducing 153 the input offset voltage of the combined main and zeroing amplifiers includes: applying 162 a zero signal to the input terminals of the main amplifier; connecting 164 the output of the main amplifier to the input of the "offset corrected" zeroing amplifier; connecting 166 the output of the zeroing amplifier, via negative feedback, to the offset adjustment input of the main amplifier; and generating and storing 168 an adjustment voltage that reduces the input offset voltage of the main amplifier. Method 150 includes the step of returning 170 the amplified high resolution signal to the operating input range of the next amplification stage to provide fast response to its next input signal.

Although specific features of this invention are shown in some drawings and not others, this is for convenience only as each feature may be combined with any or all of the other features in accordance with this invention.

Other embodiments will occur to those skilled in the art and are within the following claims.

What is claimed is:

1. A multi-stage, low-offset, fast-recovery, comparator system comprising:

a plurality of self-correcting amplification stages connected in series, each said amplification stage having a reset switch connected at its output for returning the output of each said amplification stage to the operating input range of the next stage and providing fast response to its next input signal, each said amplification stage including:
      a main amplifier, having a signal input terminal and an offset adjustment input terminal, said main amplifier responsive to an input for generating an output; and
      a local feedback circuit, responsive to said output, for providing an offset adjustment signal to said offset adjustment input terminal to compensate for the local offset voltage of said main amplifier.

2. The comparator system of claim 1 wherein said local feedback circuit includes a zeroing amplifier circuit having an input terminal responsive to said output, for generating said offset adjustment signal.

3. The comparator system of claim 2 wherein said local feedback circuit further includes:

first switching means for applying said offset adjustment signal to said offset adjustment input terminal of said main amplifier;
   second switching means for applying said output of said main amplifier to said input terminal of said zeroing amplifier circuit;
   third switching means for applying a zero input signal to said signal input terminal of said main amplifier; and
   fourth switching means for applying the output of the previous amplification stage to the signal input terminal of said main amplifier.

4. The comparator system of claim 2 wherein said zeroing amplifier circuit includes a zeroing amplifier offset reduction circuit to minimize an input offset voltage of said zeroing amplifier circuit.

5. The comparator system of claim 4 wherein said zeroing amplifier circuit has a zero adjustment input terminal, said zeroing amplifier offset reduction circuit including:

first switching means for applying said offset adjustment signal to said zero adjustment input terminal; and
   second switching means for applying a predetermined zeroing signal to said input terminal of said zeroing amplifier circuit.

6. A multi-stage, low-offset, fast-recovery, comparator system comprising:

a plurality of self-correcting amplification stages connected in series, each said amplification stage having a reset switch connected at its output for returning the output of each said amplification stage to the operating input range of the next stage and providing fast response to its next input signal, each said amplification stage including:
      a main amplifier having a signal input terminal and an offset adjustment input terminal, said main amplifier responsive to an input for generating an output; and
      a local feedback circuit, responsive to said output, for providing an offset adjustment signal to said offset adjustment input terminal to compensate for the local offset voltage of said main amplifier, said local feedback circuit including:
         a zeroing amplifier circuit having an input terminal responsive to said output for generating said offset adjustment signal, said zeroing amplifier circuit including a zeroing amplifier offset reduction circuit to minimize an input offset voltage of said zeroing amplifier circuit.

7. The comparator system of claim 6 wherein said local feedback circuit further includes:

first switching means for applying said offset adjustment signal to said offset adjustment input terminal of said main amplifier;
   second switching means for applying said output of said main amplifier to said input terminal of said zeroing amplifier;
   third switching means for applying a zero input signal to said signal input terminal of said main amplifier; and
   fourth switching means for applying the output of the previous amplification stage to the signal input terminal of said main amplifier.

8. The comparator system of claim 6 wherein said zeroing amplifier circuit has a zero adjustment input terminal, said zeroing amplifier offset reduction circuit including:

first switching means for applying said offset adjustment signal to said zero adjustment input terminal; and
   second switching means for applying a predetermined zeroing signal to said input terminal of said zeroing amplifier.

9. A method of reducing voltage offset in a single amplification stage of a multistage amplifier, the amplification state having a zeroing amplifier and a main amplifier, including the steps of:

reducing the input offset voltage of the said zeroing amplifier by a factor essentially equal to the gain of the said zeroing amplifier;
   reducing the input offset voltage of said combined main and zeroing amplifiers by a factor essentially equal to the product of the gains of said main and zeroing amplifier; and amplifying an input signal to said amplification stage in accordance with the gain of said main amplifier to generate an amplified high resolution signal.

10. The method of claim 9 wherein the step of reducing the input offset voltage of the zeroing amplifier includes the steps of:

applying a zeroing signal to the input terminals of said zeroing amplifier;

connecting the zeroing amplifier output signal, via negative feedback, to the zeroing amplifier; and generating and storing an adjustment voltage that reduces an input offset voltage of said zeroing amplifier.

11. A method of claim 9 wherein the step of reducing the input offset voltage of the main amplifier includes the steps of:

applying a zeroing signal to the main amplifier;

connecting the output of the main amplifier to the input of the offset corrected zeroing amplifier;

connecting the output of the zeroing amplifier, via negative feedback, to the main amplifier; and generating and storing an adjustment voltage that reduces an input offset voltage of said main amplifier.

12. The method of claim 15 further including the step of returning the amplified high resolution signal to the operating input range of the next amplification stage to provide fast response to its next input signal.

13. A multi-stage, low-offset, fast-recovery, comparator system comprising:

a plurality of offset-corrected amplification stages connected in series, each said amplification stage including:

a reset switch connected at its output for returning the output of each said amplification stage to the operating input range of the next stage and providing fast response to its next input signal, where each said amplification stage is DC-coupled to the next amplification stage in the series;

a main amplifier, having a signal input terminal and an offset adjustment input terminal, said main amplifier responsive to an input for generating an output; and a local feedback circuit, responsive to said output, for providing an offset adjustment signal to said offset adjustment input terminal to compensate for the local offset voltage of said main amplifier.

14. The comparator system of claim 13 wherein said local feedback circuit includes a zeroing amplifier circuit having an input terminal responsive to said output for generating said offset adjustment signal.

15. The comparator system of claim 14 wherein said local feedback circuit further includes:

first switching means for applying said offset adjustment signal to said offset adjustment input terminal of said main amplifier;

second switching means for applying said output of said main amplifier to said input terminal of said zeroing amplifier circuit;

third switching means for applying a zero input signal to said signal input terminal of said main amplifier; and fourth switching means for applying the output of the previous amplification stage to the signal input terminal of said main amplifier.

16. The comparator system of claim 14 wherein said zeroing amplifier circuit includes a zeroing amplifier offset reduction circuit to minimize an input offset voltage of said zeroing amplifier.

17. The comparator system of claim 16 wherein said zeroing amplifier offset reduction circuit includes:

first switching means for applying said offset adjustment signal to said zero adjustment input terminal; and second switching means for applying a predetermined zeroing signal to said input terminal of said zeroing amplifier circuit.

* * * * *